(12) United States Patent
Bas et al.

(10) Patent No.: US 9,255,355 B2
(45) Date of Patent: Feb. 9, 2016

(54) CONTROL-PANEL ASSEMBLY FOR HOUSEHOLD APPLIANCES AND HOUSEHOLD APPLIANCE PROVIDED WITH SUCH CONTROL-PANEL ASSEMBLY

(75) Inventors: Alberto Bas, Sesto al Reghena (IT); Fernando De Luca, Sacile (IT); Andrea De Pellegrin, San Quirino (IT); Rodolfo Marcuz, Pordenone (IT); Stefano Morandini, San Vito al Tagliamento (IT)

(73) Assignee: Electrolux Home Products Corporation N.V., Brussels (BE)

( * ) Notice: Subject to any disclaimer, the term of this patent is extended or adjusted under 35 U.S.C. 154(b) by 323 days.

(21) Appl. No.: 13/988,042

(22) PCT Filed: Nov. 23, 2011

(86) PCT No.: PCT/EP2011/070850
§ 371 (c)(1),
(2), (4) Date: Aug. 2, 2013

(87) PCT Pub. No.: WO2012/072469
PCT Pub. Date: Jun. 7, 2012

(65) Prior Publication Data
US 2014/0049926 A1 Feb. 20, 2014

(30) Foreign Application Priority Data
Nov. 29, 2010 (EP) .................................... 10192941

(51) Int. Cl.
*H05K 7/02* (2006.01)
*H05K 7/04* (2006.01)
*D06F 39/00* (2006.01)
*H05K 1/00* (2006.01)
*H05K 5/02* (2006.01)
*A47L 15/42* (2006.01)
*F25D 29/00* (2006.01)

(52) U.S. Cl.
CPC .............. *D06F 39/00* (2013.01); *D06F 39/005* (2013.01); *H05K 1/00* (2013.01); *H05K 5/0247* (2013.01); *A47L 15/4293* (2013.01); *F25D 29/005* (2013.01)

(58) Field of Classification Search
CPC .......... D06F 39/005; H05K 1/00; H05K 5/02; H05K 5/0247; H02J 13/00; A47L 15/4293; F25D 29/005
USPC ......... 361/749, 752, 753, 807, 728, 730, 732, 361/759, 801, 825, 809, 810; 174/138 E, 174/138 G
See application file for complete search history.

(56) References Cited

U.S. PATENT DOCUMENTS

2008/0256984 A1* 10/2008 Lim et al. ................... 68/12.23
2010/0177494 A1 7/2010 Kim et al.

FOREIGN PATENT DOCUMENTS

DE 102004036175 B4 * 1/2008
EP 1 786 107 5/2007
(Continued)

OTHER PUBLICATIONS

International Search Report issued in corresponding International Application No. PCT/EP2011/070850, mailed Jan. 11, 2012.

*Primary Examiner* — Hung S Bui
(74) *Attorney, Agent, or Firm* — Banner & Witcoff, Ltd.

(57) ABSTRACT

The control-panel assembly (1) for household appliances and the like, includes: an outer dashboard (2), and at least one rigid protecting box (4). The outer dashboard (2) is provided with at least one protruding appendix (7) that sticks out of its rear face (2r) and that has a coupling ridge (7a) provided with a number of consecutive coupling segments (7b) that are tilted relative to one another. The protecting box (4) is provided with a corresponding cap appendix (8) dimensioned for resting onto the top of the protruding appendix (7), and which has at least one coupling portion (8a) which is shaped for stably matching with any one of the consecutive coupling segments (7b) of the coupling ridge (7a) of the protruding appendix (7). This allows a discrete adjustment of the spatial orientation of the protecting box (4) with respect to the rear face (2r) of the outer dashboard (2).

18 Claims, 4 Drawing Sheets

(56) References Cited

FOREIGN PATENT DOCUMENTS

| EP | 1 806 446 | 7/2007 |
| JP | 62-165982 | 7/1987 |
| JP | 1-214396 | 8/1989 |
| JP | 2010-069192 | 4/2010 |

* cited by examiner

CONTROL-PANEL ASSEMBLY FOR HOUSEHOLD APPLIANCES AND HOUSEHOLD APPLIANCE PROVIDED WITH SUCH CONTROL-PANEL ASSEMBLY

BACKGROUND

The present invention relates to a control-panel assembly for household appliances and to a household appliance provided with such control-panel assembly.

In particular the present invention relates to a control-panel assembly for home laundry washing and/or drying machines, to which the following description refers purely by way of example without implying any loss of generality.

As is known, almost any currently marketed front-loading home laundry washing and/or drying machine comprises: a substantially parallelepiped-shaped, rigid outer boxlike casing structured for resting on the floor; a substantially bell-shaped washing tub which is suspended in floating manner inside the casing, directly facing a laundry loading and unloading through opening realized in the front face of the casing; a substantially cylindrical, elastically-deformable bellows which connects the front opening of the washing tub to the laundry loading and unloading opening formed in the front face of the casing; a porthole door which is hinged to the front face of the casing to rotate to and from a closing position in which the door closes the laundry loading and unloading through opening in the front face of the casing to seal the washing tub; and a substantially cylindrical, bell-shaped revolving drum structured for housing the laundry to be washed and/or dried, and which is housed inside the washing tub in axially rotating manner about its substantially horizontally-oriented longitudinal axis.

In addition to the above, the laundry washing and/or drying machine is provided with an electrically-powered motor assembly which is located immediately outside of the washing tub, and which is structured for selectively driving into rotation the revolving drum about its longitudinal axis inside the washing tub; with an outer manually-operated control panel which is usually located on the front face of the casing, immediately above the laundry loading and unloading opening; and with an electronic central control unit which is structured for directly controlling the electric motor of the motor assembly and other electrically-operated component parts of the household appliance, according to the washing and/or drying cycle selected by the user via the control panel.

In the currently marketed laundry washing and/or drying machines, the manually-operated control panel comprises: a rigid shell-shaped dashboard which usually forms part of the upper portion of the front face of the outer boxlike casing; an internal printed circuit board which is generally provided with one or more manually-operated rotatable knob selectors and/or buttons and/or switches and/or LED warning lights and/or alphanumeric displays necessary for allowing the user to manually select the desired washing and/or drying cycle among the ones stored in the central control unit; and a substantially basin-shaped, rigid protecting box, which houses and directly supports the printed circuit board, and is structured for being firmly fixed to the back of the dashboard via anchoring screws.

More specifically, the manually-operated rotatable knob selectors, buttons, switches, warning lights and/or alphanumeric displays are all located on the upper face of the printed circuit board, i.e. on the face opposite to the bottom of the protecting box; and the protecting box is firmly fixed to the back of the dashboard, with the mouth facing the dashboard, so that the board upper face supporting all rotatable knob selectors, buttons, switches, warning lights and/or alphanumeric displays is directly faced to the back of the dashboard.

The outer dashboard, in turn, is provided with a number of pass-through openings and/or seats which are spatially arranged and dimensioned for being engaged respectively by the shaft of the rotatable knob selector, and by the other buttons, switches, warning lights and/or alphanumeric displays of the printed circuit board, so that the shaft of the knob selector, and each other button, switch, warning light, and/or alphanumeric display jutting out of the protecting box can fit into a corresponding pass-through opening or seat realized on the dashboard.

Obviously the shaft of the rotatable knob selector has to be always locally substantially perpendicular to the outer surface of the dashboard, thus an almost perfect alignment is requested between the protecting box that supports the internal printed circuit board and the corresponding pass-through openings and seats on the dashboard.

Unluckily this strict assembly requirement causes the protecting box of a control-panel assembly suitable for a front-loading laundry washing and/or drying machine to be completely different in shape from the protecting box of a control-panel assembly suitable for a top-loading laundry washing and/or drying machine, even if the internal printed circuit board is usually identical for both household appliances.

In fact, on front-loading laundry washing and/or drying machines the control-panel assembly is located on the front wall of the casing, and the front face of the dashboard is substantially vertically oriented and convex in shape; whereas on top-loading laundry washing and/or drying machines the control-panel assembly is located on the top wall of the casing, and the front face of the dashboard is tilted to the vertical and substantially concave in shape.

Obviously, the need to have two different protecting boxes structured for housing an identical printed circuit board greatly influences the production, warehousing and managing costs associated to a control-panel assembly for household appliances. Thus the savings correlated to the sharing of a control-panel assembly between a number of top-loading and front-loading laundry washing and/or drying machines are relatively small.

SUMMARY OF SELECTED INVENTIVE ASPECTS

An aim of the present invention is to provide a control-panel assembly which can be used in both front-loading and top loading laundry washing and/or drying machines, and which is additionally cost-effective to produce.

In compliance with the above aims, according to an aspect of the present invention there is provided a control-panel assembly for household appliances and the like, which comprises:

a substantially shell-shaped, outer dashboard which is structured for being coupled to the casing of the household appliance;

an internal printed circuit board which is provided with one or more display devices and/or with one or more manually-operated input devices; and at least one substantially basin-shaped, rigid protecting box, which houses all or part of said internal printed circuit board, and is structured for being firmly fixed to the rear face of the outer dashboard;

the control-panel assembly being characterized in that said outer dashboard is provided with at least one protruding appendix that sticks out of the rear face of the outer dashboard and has, on its top, a coupling ridge which is provided with a number of consecutive coupling segments that are tilted relative to one another and lay substantially on a same reference laying plane; and in that said protecting box is provided with a corresponding cap appendix which is dimensioned for resting onto the top of said protruding appendix, and which has at least one coupling portion which is shaped for stably matching with any one of the consecutive coupling segments of the coupling ridge of said protruding appendix, so as to allow a discrete adjustment of the spatial orientation of the protecting box with respect to the rear face of the outer dashboard according to the coupling segment abutted.

Furthermore and preferably, though not necessarily, said reference laying plane is locally substantially perpendicular to the rear face of the outer dashboard.

Furthermore and preferably, though not necessarily, said outer dashboard is provided with at least two protruding appendixes that stick out of the rear face of the outer dashboard, and that said at least two protruding appendixes are arranged on the rear facer of the outer dashboard so that the respective coupling ridges are aligned with one another.

Furthermore and preferably, though not necessarily, the control-panel assembly also comprises one or more mechanical locking devices structured for selectively rigidly fixing the at least one protecting box to the body of the outer dashboard.

Furthermore and preferably, though not necessarily, said mechanical locking devices are structured for selectively rigidly fixing the body of the protecting box to the body of the outer dashboard when the coupling portion of each cap appendix matches with one of the consecutive coupling segments of the coupling ridge of the corresponding protruding appendix.

Furthermore and preferably, though not necessarily, said mechanical locking devices comprise one or more snap-on locking devices and/or anchoring screws or rivets.

Furthermore and preferably, though not necessarily, each projecting appendix is a substantially flat projecting tailpiece or winglet that sticks out of the rear face of the outer dashboard and has, on its top, a number of consecutive flat segments or surfaces which lay substantially on the tailpiece reference laying plane, and are slightly tilted relative to one another so as to form, on the top of the protruding tailpiece, a multi-beveled coupling ridge having a curved profile substantially polygonal in shape.

Furthermore and preferably, though not necessarily, each projecting tailpiece or winglet is formed by a substantially U-shaped staple element that sticks out of the rear face of the outer dashboard and has, on its raised central section, a number of consecutive rectilinear segments which are tilted one another so as to form an arched portion having a substantially trapezoid-isosceles shaped profile.

Furthermore and preferably, though not necessarily, each cap appendix is a substantially cup-shaped element which is aligned to a corresponding protruding appendix, and is dimensioned for being engaged by said protruding appendix up to the bottom, so that the bottom of the cup-shaped element is allowed to directly rest onto the coupling ridge of the protruding appendix.

Furthermore and preferably, though not necessarily, the bottom of each cup-shaped element is shaped so as to match/mesh with any one of the consecutive coupling segments of the coupling ridge of the corresponding protruding appendix.

Furthermore and preferably, though not necessarily, the bottom of each cup-shaped element is shaped so as to copy the shape of part of the substantially polygonal-shaped curved profile of the coupling ridge of the corresponding protruding tailpiece or winglet, so that the bottom wall of the cup-shaped element is allowed to match/mesh with the coupling ridge of the protruding tailpiece or winglet in several different positions.

Furthermore and preferably, though not necessarily, the projecting tailpieces or winglets are arranged on the rear face of the outer dashboard, so to be located on opposite sides of each protecting box, and in that the cup-shaped elements are arranged in overhanging manner along the perimeter of each protecting box, on opposite sides of the box, so to be aligned, each to a respective protruding tailpiece or winglet facing the side of the protecting box.

Furthermore and preferably, though not necessarily, said mechanical locking devices comprises a snap-on locking spline which projects into the cup-shaped element and is shaped so to selectively hook on the back of the arched central section of the staple element when the bottom of the cup-shaped element abutment against any one of the flat segments of the arched central section of staple element.

Furthermore and preferably, though not necessarily, said mechanical locking devices comprise a pass-through anchoring screw or rivet which extends in succession across the bottom wall of the cup-shaped element, and across the coupling segment of the coupling ridge of the protruding appendix directly matching with the bottom wall of the cup-shaped element.

Moreover, according to an aspect of the present invention, there is provided a household appliance, such as for example a top-loading laundry washing and/or drying machine, a front-loading laundry washing and/or drying machine, a dishwasher or a refrigerator, of the type having an outer casing and a control panel located on said outer casing; the household appliance being characterized in that said control panel is a control-panel assembly as specified above.

BRIEF DESCRIPTION OF THE DRAWINGS

A non-limiting embodiment of the present invention will now be described, by way of example, with reference to the accompanying drawings, in which:

FIG. 6 shows a section view of a second embodiment of the FIG. 2 control-panel assembly, with parts removed for clarity; whereas

DETAILED DESCRIPTION OF EXAMPLE EMBODIMENTS

Figure 1:
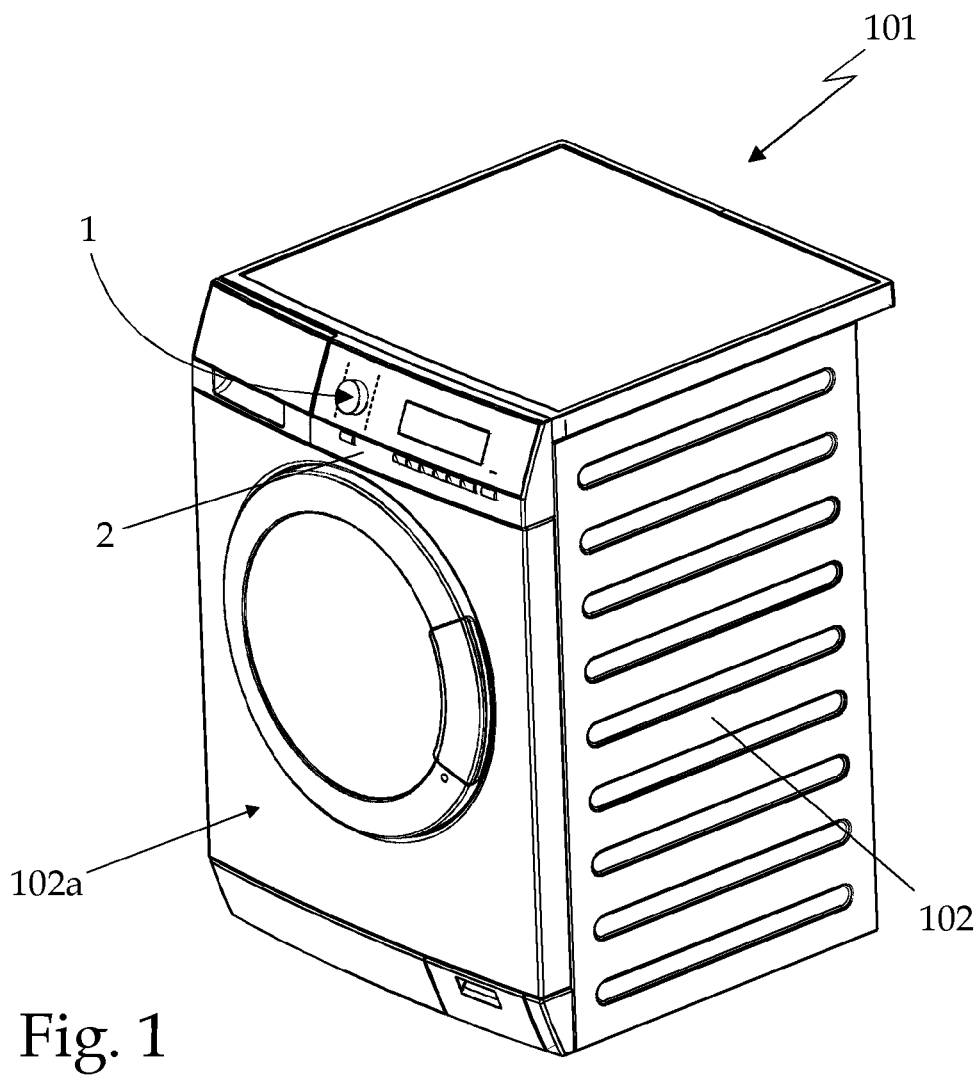
FIG. 1 shows in axonometric view a household appliance provided with a control-panel assembly realized in accordance with the teachings of the present invention.
Figure 2:
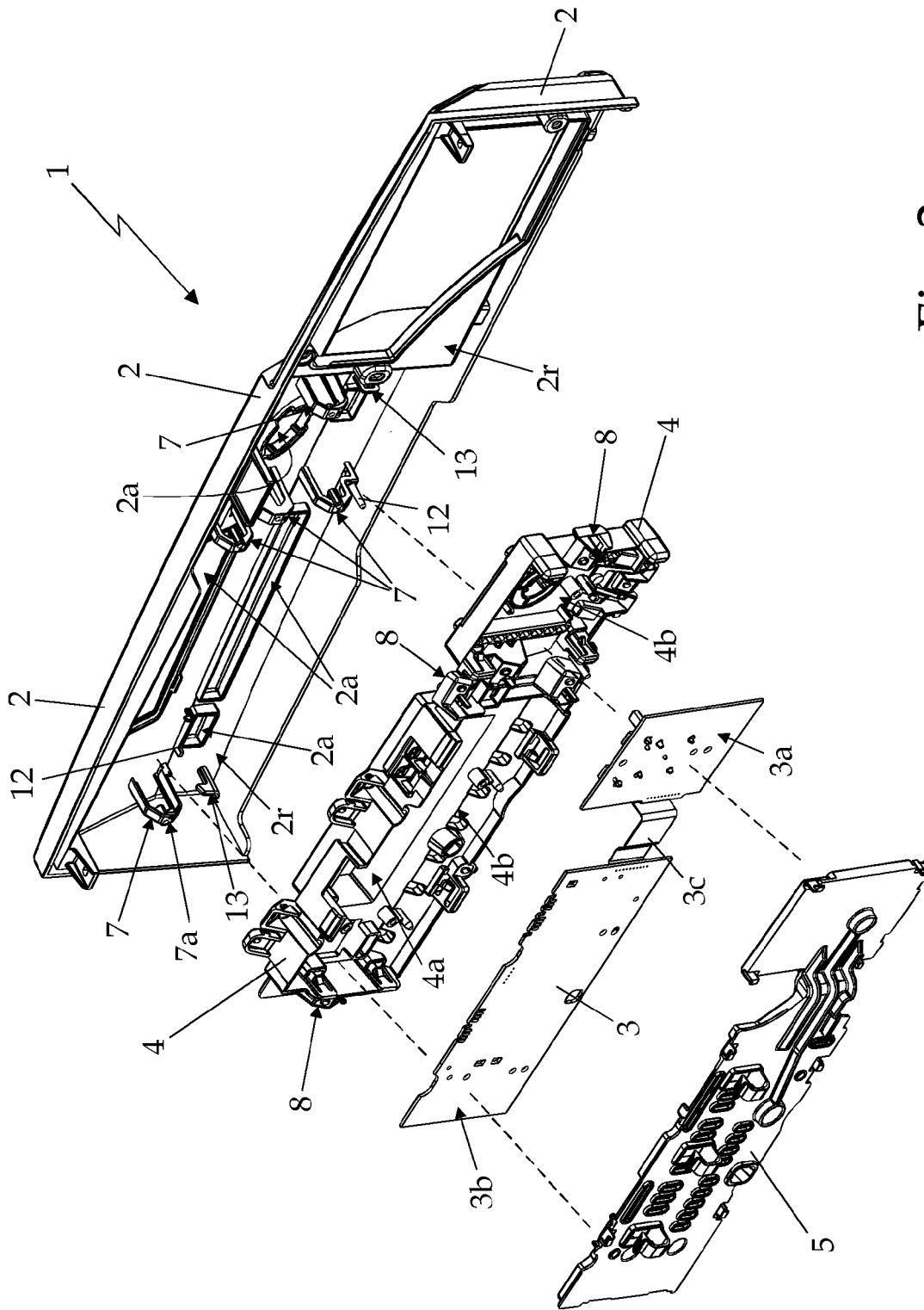
FIG. 2 shows in axonometric and partly-exploded view the control-panel assembly of the FIG. 1 household appliance.

With reference to FIGS. 1 and 2, number 1 indicates as a whole a manually-operated control-panel assembly for household appliances, which is particularly suitable for being incorporated into the outer boxlike casing of an electric household appliance 101, such as, for example, a top-loading laundry washing and/or drying machine, a front-loading laundry washing and/or drying machine, a dishwasher or a refrigerator.

In the example shown, in particular, the control-panel assembly 1 is suitable for being incorporated into the front wall 102a of the outer boxlike casing 102 of a front-loading home laundry washing and/or drying machine 101.

The control-panel assembly 1 mainly comprises a preferably, though not necessarily, substantially basin-shaped, rigid shell 2 which is structured for being coupled to the outer boxlike casing 102 of the household appliance 101, and which forms the outer dashboard 2 of the control panel; and an internal printed circuit board which is faced to the rear face 2r of the outer dashboard 2, and is provided with one or more rotatable knob selectors (the shaft of a rotatable knob selector is partly visible in FIGS. 2 and 4) and/or touch-panels and/or buttons and/or switches and/or other manually-operated input devices, and/or with one or more LED warning lights and/or alphanumeric displays and/or other display devices, all arranged on the board face facing the rear face 2r of dashboard 2.

The outer dashboard 2 is moreover provided with a number of pass-through openings and/or seats, generally indicated with number 2a, each of which is dimensioned for being engaged by a respective display device or manually-operated input device of the circuit board 3; and the internal printed circuit board 3 is arranged on the rear face 2r of dashboard 2, so that each display device or manually-operated input device of the board is aligned to, and engages a corresponding opening or seat 2a of dashboard 2.

In the example shown, in particular, the outer dashboard 2 is preferably, though not necessarily, made of plastic material, and the internal printed circuit board 3 is preferably, though not necessarily, arranged locally substantially parallel to, and spaced from the rear face 2r of dashboard 2.

Figure 3:
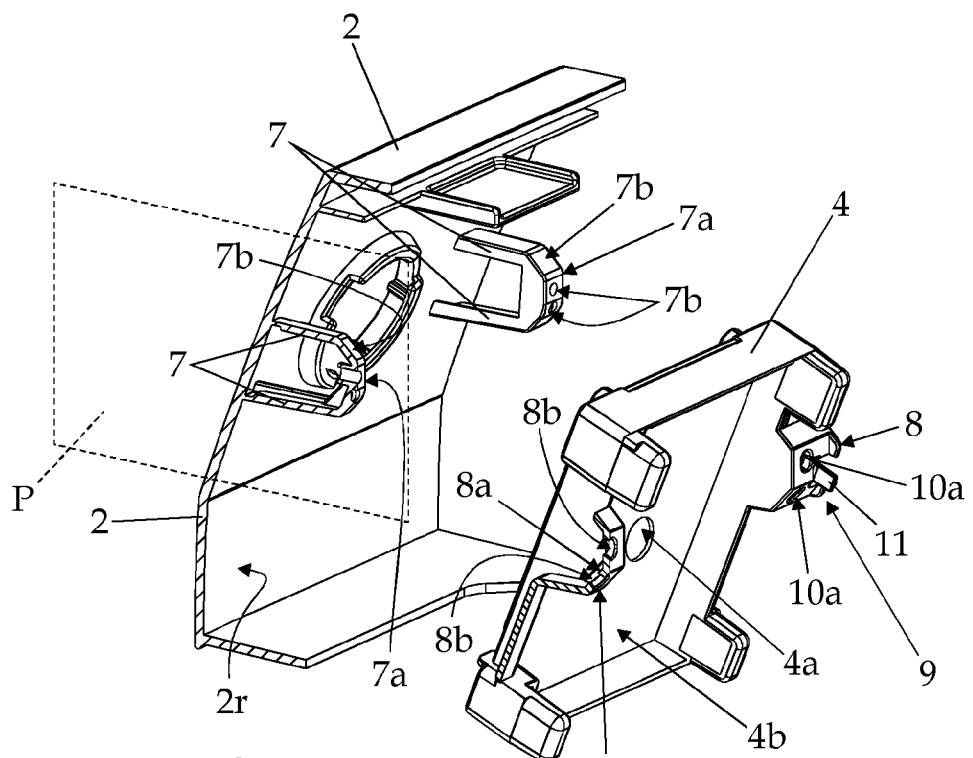
FIG. 3 shows in axonometric and partly-exploded view a first portion of the FIG. 2 control-panel assembly, with parts in section and parts removed for clarity.
Figure 4:
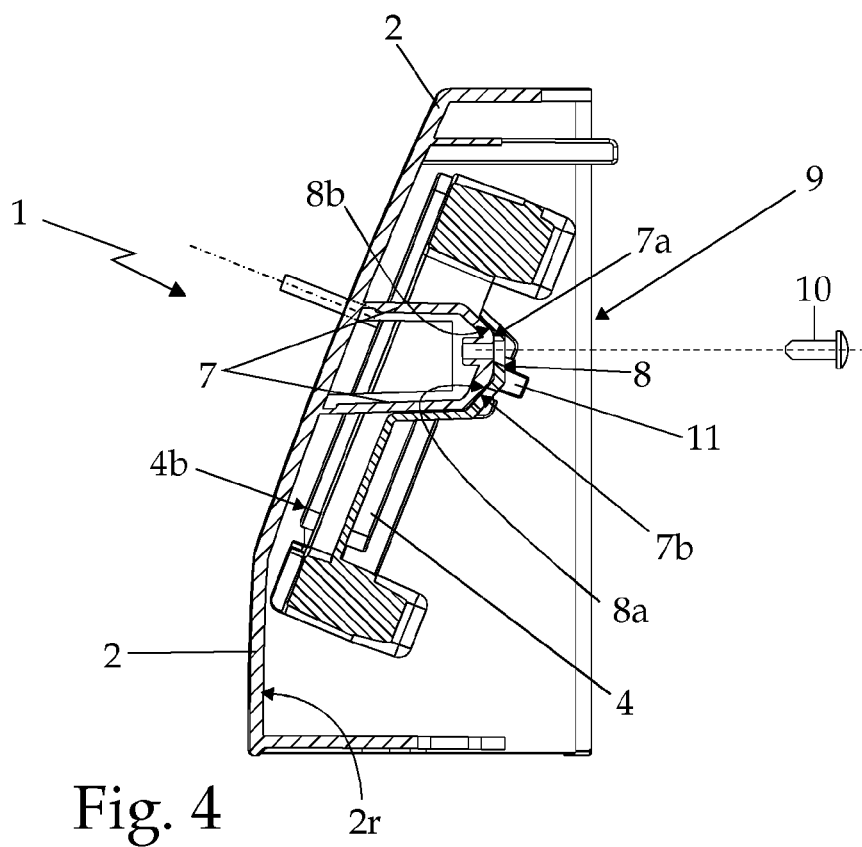
FIG. 4 shows a section view of the FIG. 3 portion of the control-panel assembly, with parts removed for clarity.

With reference to FIGS. 2, 3 and 4, control-panel assembly 1 furthermore comprises a substantially basin-shaped, rigid protecting box 4 which houses and directly supports the printed circuit board 3, and which is structured for being firmly fixed to the rear face 2r of dashboard 2, so that each display device and/or manually-operated input device of the internal circuit board 3 engages a corresponding opening or seat 2a on dashboard 2.

In the example shown, in particular, the internal printed circuit board 3 is preferably divided into two complementary pieces 3a and 3b which are reciprocally connected via a flat cable 3c; and control-panel assembly 1 is provided with two distinct substantially basin-shaped, rigid protecting boxes 4, each of which houses and directly supports a corresponding piece 3a, 3b of the printed circuit board 3, and is moreover structured for being firmly fixed to the rear face 2r of dashboard 2 so to arrange the corresponding piece 3a, 3b of the printed circuit board 3 aligned to the corresponding openings and/or seats 2a of the dashboard 2.

The two protecting boxes 4 are preferably, though not necessarily, fixed or hinged one another at a side, and are structured for being firmly fixed to the rear face 2r of dashboard 2, one beside the other, so that the display devices and/or the manually-operated input devices of the corresponding piece 3a, 3b of the printed circuit board 3 engage into the respective openings and/or seats 2a on dashboard 2.

In the example shown, in particular, piece 3a of board 3 preferably supports only a manually-operated rotatable knob selector of the control panel; whereas piece 3b of board 3 preferably supports all other display devices and manually-operated input devices of the control panel.

When the outer dashboard 2 has a considerably bulged profile, the splitting of internal printed circuit board 3 into two complementary pieces 3a and 3b, each housed/recessed into a corresponding protecting box 4, makes easier to locally correctly align the display devices and the manually-operated input devices of board 3 to the corresponding openings and/or seats 2a on the dashboard 2. Each piece 3a, 3b of the internal printed circuit board 3, in fact, is to be arranged locally substantially parallel to, and spaced from, a smaller section of the outer dashboard 2.

Alike outer dashboard 2, the/each rigid protecting box 4 is preferably, though not necessarily, made of plastic material.

Moreover, with reference to FIGS. 2, 3 and 4, each protecting box 4 preferably, though not necessarily, has, on its bottom wall 4b, a number of pass-through holes or slots 4a, each of which is dimensioned for being engaged in pass-through manner by a respective display device or manually-operated input device of the corresponding piece 3a, 3b of the internal printed circuit board 3; and it is structured for being firmly fixed to the rear face 2r of dashboard 2, with its bottom wall 4b directly faced to the rear face 2r of the outer dashboard 2, and locally substantially parallel to, and spaced from the surface of said dashboard 2. Thus all display devices and/or manually-operated input devices of the internal printed circuit board 3 have to engage in pass-through manner the bottom wall 4b of the protecting boxes 4 for reaching and fitting into the corresponding pass-through openings and/or seats 2a on dashboard 2.

In addition to the above, with reference to FIG. 2, control-panel assembly 1 is also provided with a large, rigid and substantially flat, monolithic rear lid or cover 5, which is shaped so as to contemporaneously close the mouth of both protecting boxes 4, thus covering the back of the both pieces 3a and 3b of the internal printed circuit board 3. Moreover the flat lid 5 is rigidly fixed to the body of both protecting boxes 4 so to rigidly connect the protecting boxes 4 to one another.

In the example shown, also rear lid 5 is preferably, though not necessarily, made of plastic material.

As regards the connection between dashboard 2 and protecting box or boxes 4, the outer dashboard 2 is provided with a number of protruding appendixes 7, that stick out of the rear face 2r of the outer dashboard 2 in a direction locally substantially perpendicular to the surface of the rear face 2r of the dashboard 2. Each appendix 7 has, on its top, a coupling ridge 7a which is provided with a number of consecutive coupling segments or sections 7b that lay substantially on a same reference laying plane P, and are tilted relative to one another so to have different spatial orientations with respect to the underneath rear face 2r of the dashboard 2.

Moreover, the consecutive coupling segments or sections 7b of each protruding appendix 7 are preferably, though not necessarily, tilted relative to one another so that the coupling ridge 7a of the appendix 7 has a substantially rounded and multi-beveled profile, and have preferably, though not necessarily, substantially the same shape.

With reference to FIGS. 2 and 3, the reference laying planes P of the appendixes 7 are moreover locally substantially parallel to one another and locally substantially perpendicular to the surface of the rear face 2r of the dashboard 2, so that the coupling ridges 7a of all protruding appendixes 7 are locally substantially parallel to one another. Furthermore, the protruding appendixes 7 are preferably, though not necessarily, arranged on the rear face 2r of the outer dashboard 2, so to be aligned in pairs, and to be located, in pairs, on opposite sides of the or each protecting box 4.

Instead, the/each protecting box 4 is provided with a number of corresponding cap appendixes 8 each of which is dimensioned for resting onto the top of a respective protruding appendix 7, and has at least one coupling portion 8*a* which is shaped for stably matching with any one of the consecutive coupling segments or sections 7*b* of the coupling ridge 7*a* of the corresponding appendix 7, so as to allow a discrete adjustment of the spatial orientation of the protecting box 4 with respect to the rear face 2*r* of the outer dashboard 2 according to the coupling segment 7*a* temporarily matched.

Preferably, though not necessarily, at least one of the cap appendix 8 of each protecting box 4 (all cap appendixes 8 in the example shown) is provided with a mechanical locking device 9 which is structured to selectively rigidly fix the body of the cap appendix 8 to the body of the corresponding protruding appendix 7 when the coupling portion 8*a* of the cap appendix 8 abuts against, or matches with, one of the consecutive coupling segments or sections 7*b* of the coupling ridge 7*a* on the top of the protruding appendix 7.

With reference to FIGS. 2, 3, 4 and 5, in the example shown, in particular, the outer dashboard 2 is preferably provided with a number of substantially flat, protruding tailpieces or winglets 7, that stick out of the rear face 2*r* of the outer dashboard 2 in a direction locally substantially perpendicular to the surface of the rear face 2*r* of the dashboard 2.

Each protruding tailpiece 7 forms a respective protruding appendix 7 and has, on its top, a number of consecutive flat segments or surfaces 7*b* which lay substantially on the tailpiece reference laying plane P, and are slightly tilted relative to one another, so as to form, on the top of the protruding tailpiece 7, a multi-beveled coupling ridge 7*a* having a curved profile substantially polygonal in shape.

Figure 5:
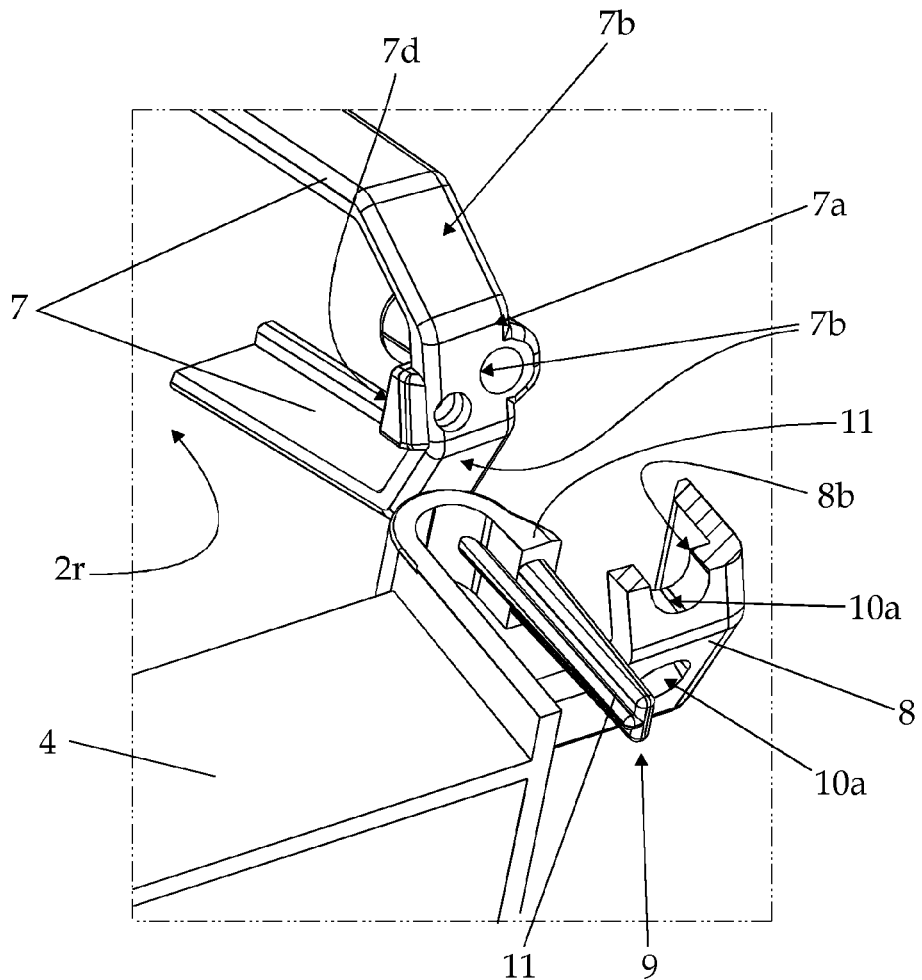
FIG. 5 shows in axonometric and partly-exploded view a second portion of the FIG. 2 control-panel assembly, with parts in section and parts removed for clarity.

With reference to FIGS. 3, 4 and 5, moreover all consecutive flat segments or surfaces 7*b* located on the top of a same protruding tailpiece 7 have preferably, though not necessarily, approximately the same width and preferably, though not necessarily, approximately the same tilt angle with respect to the adjoining flat surfaces or segments 7*b*, so as to form a multi-beveled coupling ridge 7*a* that substantially copies the profile of part of the perimeter of a substantially regular polygon.

In the example shown, in particular, each protruding tailpiece 7 of the outer dashboard 2 is preferably formed by a substantially U-shaped staple element 7 that sticks out of the rear face 2*r* of the outer dashboard 2, remaining substantially coplanar to the corresponding tailpiece reference laying planes P. This staple element 7 has, on its raised central section 7*a*, a number of consecutive rectilinear segments 7*b* (three segments in the example shown) which are inclined/tilted relative to one another so as to form an arched portion having a substantially trapezoid-isosceles shaped profile.

With reference to FIGS. 2, 3, 4 and 5, the body of the/each protecting box 4, in turn, is preferably provided with a number of cup-shaped elements 8 each of which is aligned to a corresponding protruding tailpiece 7, and is dimensioned for being engaged by the corresponding tailpiece 7 up to the bottom, so that the bottom 8*a* of the cup-shaped element 8 is allowed to directly rest onto the coupling ridge 7*a* of said tailpiece 7.

In particular, in the example shown the cup-shaped elements 8 are preferably arranged in overhanging manner along the perimeter of the protecting box 4, on opposite sides of the box, so to be aligned each to a respective protruding tailpiece 7 facing the side of the protecting box 4.

With reference to FIGS. 3 and 4, the bottom 8*a* of each cup-shaped element 8 is moreover shaped so as to copy the shape of part of the substantially polygonal-shaped curved profile of the coupling ridge 7*a* of the corresponding protruding tailpiece 7, so that the bottom wall of the cup-shaped element 8 is allowed to match/mesh with the coupling ridge 7*a* of the protruding tailpiece 7 in several different positions. Each cup-shaped element therefore forms a respective cap appendix 8 of the protecting box 4.

In the example shown, in particular, the bottom 8*a* of each substantially cup-shaped element 8 of protecting box 4 has a number of consecutive flat sections 8*b* (three flat sections 8*b* in the example shown) which are dimensioned and reciprocally tilted relative to one another so as to substantially copy the profile of part of the raised central section 7*a* of the staple element 7, so that the bottom 8*a* of the cup-shaped element 8 is allowed to stably match and rest on the raised central section 7*a* of the staple element 7 in several different positions.

Figure 6:
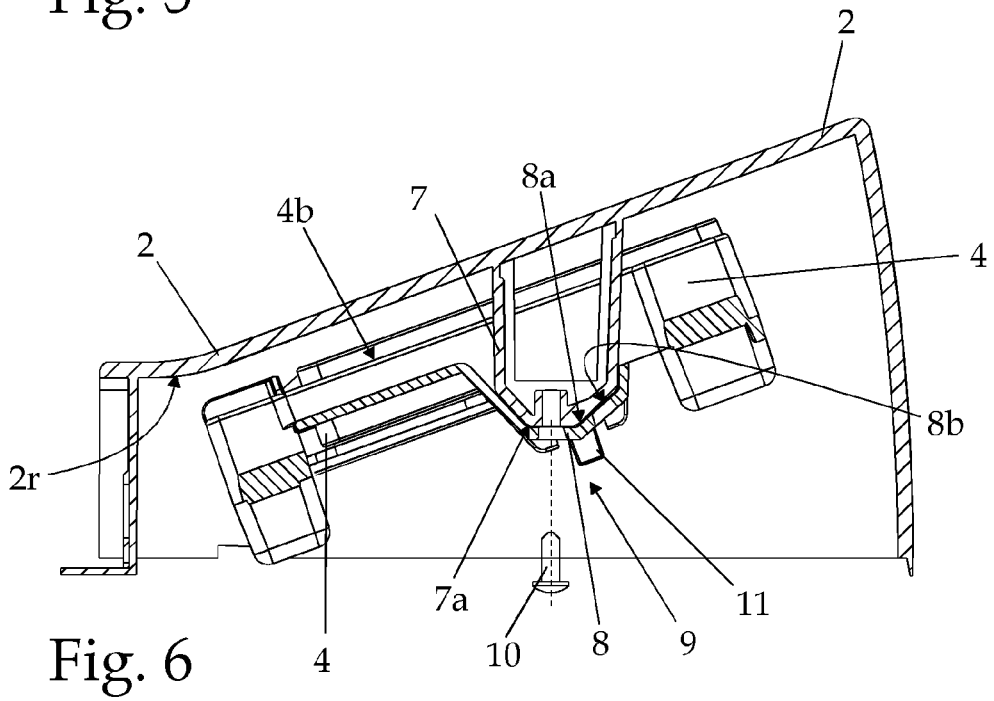

With reference to FIGS. 4 and 6, in the example shown, having as the raised central section 7*a* of the staple element 7 a substantially trapezoid-isosceles arched profile, the bottom wall 8*a* of the cup-shaped element 8 is allowed to match/mesh with the multi-beveled crest of the staple element 7 in two different positions which correspond to different spatial orientations of the protecting box 4 with respect to the dashboard 2.

With reference to FIGS. 4 and 5, the mechanical locking device 9 instead preferably, though not necessarily, comprises a pass-through anchoring screw or rivet 10 which extends in succession across the flat section 8*b* of the bottom wall 8*a* of the substantially cup-shaped element 8, and across the flat segment 7*a* of arched central section 7*a* of the staple element 7 that directly matches with the flat section 8*b* of the cup-shaped element 8. Therefore a number of pass-through holes 10*a* are realized on the flat sections 8*b* of the bottom wall 8*a* of the cup-shaped element 8, and each pass-through hole 10*a* is engaged by the anchoring screw or rivet 10 when the protecting box 4 is arranged in a corresponding spatial orientation with respect to the rear face 2*r* of the outer dashboard 2.

Additionally, the mechanical locking device 9 preferably, though not necessarily, comprises also a snap-on locking spline 11 which projects into the cup-shaped element 8 and is shaped to selectively hook on the back 7*d* of the arched central section 7*a* of the staple element 7 when the bottom 8*a* of the cup-shaped element 8 abutment against any one of the flat segments 7*a* of the arched central section 7*a* of staple element 7.

With reference to FIG. 2, the outer dashboard 2 is preferably, though not necessarily, also provided with one or more reference pins, teeth or similar projecting parts 12 which are properly shaped and arranged on the rear face 2*r* of the outer dashboard 2, so as to allow the stable fitting of the cup-shaped elements 8 on the top of the corresponding projecting tailpieces 7 only when the/each protecting box 4 is in a specific predetermined spatial orientation with respect to the rear face 2*r* of the dashboard 2.

Finally, the control-panel assembly 1 is preferably, though not necessarily, also provided with one or more additional mechanical locking devices 13 which are structured to selectively rigidly fix the body of the/each protecting box 4 directly to the rear face 2*a* of the outer dashboard 2. The reference pins or similar projecting parts 12 can advantageously be incorporated in these mechanical locking devices 13.

In the example shown, in particular, the additional mechanical locking devices 13 comprise one or more snap-on locking splines or tongues 13, which stick out of the rear face 2*r* of the outer dashboard 2 and are shaped so as to hook on the protecting box 4 when the latter is arranged in the appropriate spatial orientation with respect to the rear face 2*r* of the dashboard 2.

General operation of the control-panel assembly 1 is clearly inferable from the above description, with no further explanation required.

As regards the protruding tailpieces 7 and cup-shaped elements 8, the multi-beveled coupling ridges 8a on the top of the protruding tailpieces 7 of the outer dashboard 2 are to be shaped so to allow the cup-shaped elements 8 of the protecting box/s 4 to engage/match with the corresponding protruding tailpieces 7 in at least two different positions associated each to a corresponding specific spatial orientation of the protecting box/s 4 with respect to the rear face 2r of the dashboard 2.

More specifically, with reference to FIGS. 4 and 6, when arranged in the first spatial orientation, the protecting box/s 4 can be coupled to a first dashboard 2 specifically shaped for being incorporated in the outer boxlike casing of a first model of household appliance, such as for example a front-loading laundry washing and/or drying machine. Instead, when arranged in the second spatial orientation, each protecting box/s 4 can be coupled to a second dashboard 2 specifically shaped for being incorporated in the outer boxlike casing of a second model of household appliance, such as for example a top-loading laundry washing and/or drying machine.

The particular multi-position coupling between outer dashboard 2 and protecting box/s 4 clearly offers several advantages.

The protruding tailpieces 7, in fact, can be incorporated in two or more models of outer dashboard 2 (see FIGS. 4 and 6), thus allowing the use, for several control-panel assembles 1, of a sole model of protecting box/s 4 which is provided with a suitable number of cup-shaped elements 8 that can match with the protruding tailpieces 7 of all models of outer dashboard 2, with all cost savings concerned.

Clearly, changes may be made to the control-panel assembly 1 for household appliances as described above without, however, departing from the scope of the present invention.

Figure 7:
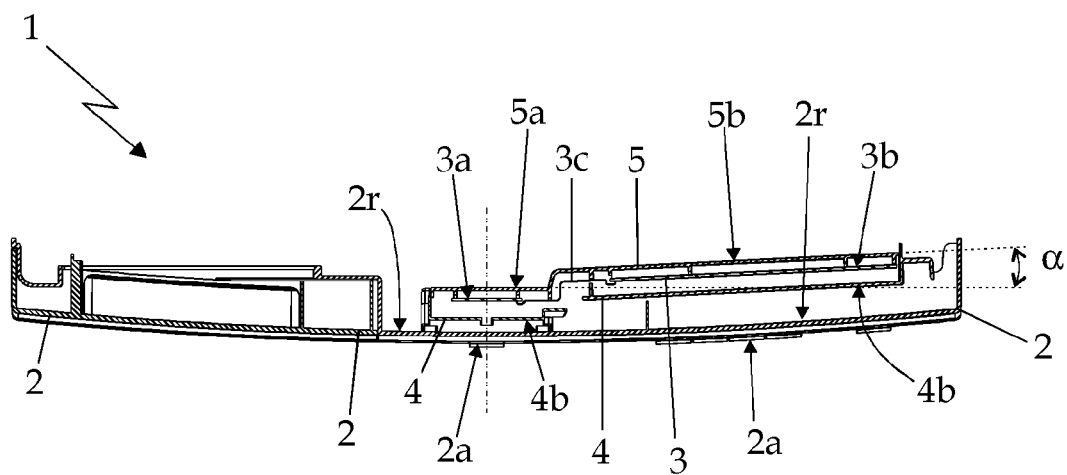
FIG. 7 shows a section view of a variation of the FIG. 2 control-panel assembly, with parts removed for clarity.

For example, with reference to FIG. 7, in a different embodiment the monolithic rear lid or cover 5 of control-panel assembly 1 has two side-by-side flat portions 5a and 5b made in a single piece construction (made by molding for example), each of which is dimensioned for closing a corresponding protecting box 4 and lies on a respective reference laying plane. The reference laying planes of the two flat portions 5a and 5b are locally inclined/tilted relative to one another at a given tilt angle α greater than 0°, so to force the protecting boxes 4 to assume an inclined layout that puts each protecting box 4 locally substantially parallel to a corresponding portion of the rear face 2r of outer dasher 2.

The presence of the monolithic rear lid or cover 5 is clearly independent from the referred-above connection system between the outer dashboard 2 and the protecting box boxes 4.

The invention claimed is:

1. A control-panel assembly for household appliances, which comprises:
   a substantially shell-shaped, outer dashboard which is structured for being coupled to a casing of a household appliance;
   an internal printed circuit board which is provided with one or more display devices and/or with one or more manually-operated input devices; and
   at least one substantially basin-shaped, rigid protecting box, which houses all or part of said internal printed circuit board, and is structured for being firmly fixed to the rear face of the outer dashboard;
wherein, said outer dashboard is provided with at least one protruding appendix that sticks out of the rear face of the outer dashboard and has, on its top, a coupling ridge which is provided with a plurality of consecutive coupling segments that are tilted relative to one another and lay substantially on a same reference laying plane; and in that said protecting box is provided with a corresponding cap appendix which is dimensioned for resting onto the top of said protruding appendix, and which has at least one coupling portion which is shaped for stably matching with any one of the consecutive coupling segments of the coupling ridge of said protruding appendix, so as to allow a discrete adjustment of the spatial orientation of the protecting box with respect to the rear face of the outer dashboard according to the coupling segment abutted.

2. The control-panel assembly according to claim 1, wherein said reference laying plane is locally substantially perpendicular to the rear face of the outer dashboard.

3. The control-panel assembly according to claim 1, wherein said outer dashboard is provided with at least two protruding appendixes that sticks out of the rear face of the outer dashboard, and that said at least two protruding appendixes are arranged on the rear face of the outer dashboard so that the respective coupling ridges are aligned one to another.

4. The control-panel assembly according to claim 1, further comprising one or more mechanical locking devices structured for selectively rigidly fixing the at least one protecting box to the body of the outer dashboard.

5. The control-panel assembly according to claim 4, wherein said mechanical locking devices are structured for selectively rigidly fixing the body of the protecting box to the body of the outer dashboard (2) when the coupling portion of each cap appendix matches with one of the consecutive coupling segments of the coupling ridge of the corresponding protruding appendix.

6. The control-panel assembly according to claim 5, wherein said mechanical locking devices comprise one or more snap-on locking device and/or anchoring screws or rivets.

7. The control-panel assembly according to claim 4, wherein said mechanical locking devices comprise one or more snap-on locking device and/or anchoring screws or rivets.

8. The control-panel assembly according to claim 1, wherein each projecting appendix comprises a substantially flat projecting tailpiece or winglet that sticks out of the rear face (2r) of the outer dashboard and has, on its top, a number of consecutive flat segments or surfaces which lay substantially on the tailpiece reference laying plane, and are tilted relative to one another so as to form, on the top of the protruding tailpiece, a multi-beveled coupling ridge having a profile substantially polygonal in shape.

9. The control-panel assembly according to claim 8, wherein each projecting tailpiece or winglet is formed by a substantially U-shaped staple element that sticks out of the rear face of the outer dashboard and has, on its raised central section, a number of consecutive rectilinear segments which are tilted relative to one another so as to form an arched portion having a substantially trapezoid-isosceles shaped profile.

10. A control panel assembly according to claim 9, wherein each cap appendix comprises a substantially cup-shaped element which is aligned to a corresponding protruding appendix, and is dimensioned for being engaged by said protruding appendix up to the bottom, so that the bottom of the cup-shaped element is allowed to directly rest onto the coupling ridge of the protruding appendix.

11. A control panel assembly according to claim 8, wherein each cap appendix comprises a substantially cup-shaped element which is aligned to a corresponding protruding appendix, and is dimensioned for being engaged by said protruding appendix up to the bottom, so that the bottom of the cup-shaped element is allowed to directly rest onto the coupling ridge of the protruding appendix.

12. The control-panel assembly according to claim 1, wherein each cap appendix comprises a substantially cup-shaped element which is aligned to a corresponding protruding appendix, and is dimensioned for being engaged by said protruding appendix up to the bottom, so that the bottom of the cup-shaped element is allowed to directly rest onto the coupling ridge of the protruding appendix.

13. The control-panel assembly according to claim 12, wherein the bottom of each cup-shaped element is shaped so as to match/mesh with any one of the consecutive coupling segments of the coupling ridge of the corresponding protruding appendix.

14. The control-panel assembly according to claim 12, wherein the bottom of each cup-shaped element is shaped so as to copy the shape of part of the substantially polygonal-shaped curved profile of the coupling ridge of the corresponding protruding tailpiece or winglet, so that the bottom wall of the cup-shaped element is allowed to match/mesh with the coupling ridge of the protruding tailpiece or winglet in several different positions.

15. The control-panel assembly according to claim 12, wherein a pair of said projecting tailpieces or winglets are arranged on the rear face of the outer dashboard, so to be located on opposite sides of a said protecting box, and in that the cup-shaped elements are arranged in overhanging manner along the perimeter of the said protecting box, on opposite sides of the protecting box, so to be aligned, each to a respective protruding tailpiece or winglet facing the side of the protecting box.

16. The control-panel assembly according to claim 12, wherein said mechanical locking devices comprise a snap-on locking spline which projects into the cup-shaped element and is shaped so to selectively hook on the back of the arched central section of the protruding appendix when the bottom of the cup-shaped element abutment against any one of the flat segments of the central section of the protruding appendix.

17. The control-panel assembly according to claim 12, wherein said mechanical locking devices comprises a pass-through anchoring screw or rivet which extends in succession across the bottom of the cup-shaped element, and across the coupling segment of the coupling ridge of the protruding appendix directly matching with the bottom wall of the cup-shaped element.

18. A household appliance having an outer casing and a control panel located on said outer casing; said control panel comprising a control-panel assembly according to claim 1.

\* \* \* \* \*